United States Patent [19]

Hirsch

[11] Patent Number: 4,736,454
[45] Date of Patent: Apr. 5, 1988

[54] INTEGRATED OSCILLATOR AND MICROSTRIP ANTENNA SYSTEM

[75] Inventor: Vincent A. Hirsch, Boulder, Colo.

[73] Assignee: Ball Corporation, Muncie, Ind.

[21] Appl. No.: 532,556

[22] Filed: Sep. 15, 1983

[51] Int. Cl.$^4$ .............................................. H04B 1/04
[52] U.S. Cl. .................................... 455/129; 455/124; 331/107 R
[58] Field of Search .............................. 455/129, 124; 343/700 MS File, 6.8 R, 7 PF, 6.5 SS, 18 E, 18 D; 331/107 SL, 108 D; 333/33

[56] References Cited

U.S. PATENT DOCUMENTS

| | | |
|---|---|---|
| 3,629,724 | 12/1971 | Shiga . |
| 3,778,717 | 12/1973 | Okoshi et al. . |
| 3,986,153 | 10/1976 | Kuno et al. . |
| 4,034,313 | 7/1977 | Jones et al. . |
| 4,185,252 | 1/1980 | Gerlach . |
| 4,310,809 | 1/1982 | Buck et al. . |
| 4,331,940 | 5/1982 | Uwano . |
| 4,365,214 | 12/1982 | Shillady . |
| 4,435,848 | 3/1984 | Sedlmair . |
| 4,445,097 | 4/1984 | Godart et al. ................. 331/107 SL |
| 4,450,408 | 5/1984 | Tiemann . |
| 4,453,269 | 6/1984 | Skar ..................................... 455/129 |
| 4,607,323 | 8/1986 | Sokal et al. . |

FOREIGN PATENT DOCUMENTS

| | | |
|---|---|---|
| 0066094 | 12/1982 | European Pat. Off. ..... 343/700 MS |
| 38705 | 3/1980 | Japan . |
| 2046530 | 11/1980 | United Kingdom ........ 343/700 MS |

OTHER PUBLICATIONS

Pretorius, S-Parameter Design of A Microstrip Transistor Oscillator, The Transactions of the S. A. Institute of Electrical Engineers, Feb. 1980, pp. 33-37.
Greiser, Coplanar Stripline Antenna, Microwave Journal, Oct. 1976, pp. 47-49.
J. Gonda, "Large Signal Transistor Oscillator Design", IEEE MTT-S International Microwave Symposium Digest, 1972, pp. 110-112.
Walter Wagner, "Oscillator Design by Device Line Measurement", Microwave Journal, vol. 22, pp. 43-48, Feb. 1979.
Hewlett-Packard Application Note 95-1, "S-Parameter Techniques for Faster More Accurate Network Design", p. 10.
Dennis Poulin, "Load-Pull Measurements Help Meet Your Match", Microwaves, vol. 19, pp. 61-65 (Nov. 1980).
Hewlett-Packard Application Note 975, "A4.3 GHz Oscillator Using the HXTR-4101 Bipolar Transistor".
Hewlett-Packard Application Note 981, "The Design of a 900 MHz Oscillator with the HXTR-3102".
Microwave Semiconductor Application Note TE-213, "GaAs FET Power Oscillators".
The ARRL Antenna Book, p. 86 et seq. (American Radio Relay League, 13th Ed., 1976).

Primary Examiner—Theodore M. Blum
Attorney, Agent, or Firm—Gilbert E. Alberding

[57] ABSTRACT

A three-element active device is physically and electrically integrated (e.g., by soldering) onto shaped conductive areas in a thin conformable microstrip structure which includes a microstrip antenna radiator. Two of the elements of the active device are connected to microstrip reactance structures which form a series-resonant partial oscillator circuit. The third (output) element of the active device is connected directly to the microstrip antenna radiator via a microstrip transmission line which, together, directly provide the r.f. load impedance for the thus completed oscillator circuit. Quarter wavelength r.f. microstrip segments are also provided to facilitate the feeding of d.c. bias to the active device without disturbing the r.f. circuitry. The oscillator load impedance to be provided by the microstrip radiator is predetermined in accordance with conventional device-line or loadpull impedance measurements so as to maximize the power output of the active device.

34 Claims, 2 Drawing Sheets

FIG. 5
MATCHING CIRCUIT CONSISTING OF
FEEDLINE & ANTENNA PATCH

FIG. 6
COMMON-GATE OSCILLATENNA
(SELF-BIASED)

INTEGRATED OSCILLATOR AND MICROSTRIP ANTENNA SYSTEM

This invention relates to an integrated oscillator and antenna system formed in a thin conformable structure. Such structures have many useful applications but may be especially useful in doppler radar ranging systems as, for example, a component of a radio frequency proximity fuze for armaments.

The potential advantages of a proximity fuze r.f. front-end including a self-oscillating antenna system have been recognized for many years. Such advantages would include, for example, ease of fabrication, a reduced number of circuit components, high product yields, and low costs.

When designing antenna systems for doppler radars used in projectile or missile proximity fuzing, the typical conventional approach requires an antenna system with a 50 ohm output impedance. The oscillator is mounted on a circuit board on which a microstrip antenna system is printed. This configuration has several disadvantages:

Changes in the circuit board dielectric constant and variations in the etching techniques used to fabricate the microstrip antenna elements result in antenna resonant frequency shifts. This produces a suboptimal impedance match between the oscillator and antenna system. Maximum power at the desired frequencies is not radiated.

The hybrid oscillator must be mounted on the top or bottom side of the antenna. This results in a system which is not low profile and difficult to mount or dismount for repair.

Hybrid integrated circuit oscillators are generally expensive and not simple to fabricate.

One approach which has been used to produce an integrated oscillator and antenna system utilized a feedback loop between the antenna and oscillator. The antenna then becomes part of the primary frequency determining network. The major problem with this approach has been low operating efficiencies.

Oscillatennas fabricated in the past are believed to have had relatively low operating efficiencies and/or high 1/f (flicker) noise and phase noise. Furthermore, the integration of a separate hybrid microwave integrated circuit (MIC) oscillator with an antenna, both having 50 ohm interface impedances for example, is costly and often does not provide optimum performance because of antenna resonant frequency variations due to material property tolerances or variations in the fabrication processes used to manufacture the antenna as noted above.

Some examples of prior art approaches to microwave integrated circuit (MIC) oscillator design are illustrated by the following:
U.S. Pat. No. 3,629,724—Shiga (1971)
U.S. Pat. No. 3,778,717—Okoshi et al (1973)
U.S. Pat. No. 3,986,153—Kuno et al (1976)
U.S. Pat. No. 4,034,313—Jones et al (1977)
U.S. Pat. No. 4,185,252—Gerlach (1980)
U.S. Pat. No. 4,331,940—Uwano (1982)
Japanese Patent No. 38,705—Takeda (1980)

Of this group, Okoshi et al is possibly the most pertinent for its teaching of a unified (and apparently conformal) integrated oscillator/antenna structure including a shaped single layer of conductive surfaces spaced from an underlying electrical conductive reference surface by a relatively thin dielectric layer. However, Okoshi et al teach only the use of a two-element active device (i.e., a Gunn diode) that is inherently quite inefficient. Furthermore, Okoshi et al teach the use of a separate resonator structure in addition to a radiator which itself comprises a small non-resonant slit in the middle of the resonator structure. Okoshi et al do not appear to teach how a three-element active device might be accommodated in such a thin conformal structure nor do they teach the use of a microstrip type radiator patch which, together with a transmission line, may directly provide the r.f. load impedance for the oscillator and maximize power output therefrom.

Of course, the microstrip antenna including its radiator and transmission line feed is by now a well known structure in and of itself. In its simplest form, the microstrip radiator patch may simply be a square or rectangular element fed at one of its edges by an integral microstrip transmission line. This shaped transmission line/radiator surface is typically supported a very short distance above a ground plane by a dielectric sheet or layer having a thickness substantially less than one-fourth wavelength at the intended operating frequency (e.g., typically on the order of one-tenth wavelength or less). The resonant dimension of such a radiating patch is typically chosen to be one-half wavelength thus providing a pair of radiating slots between opposed edges (e.g. transverse to the feedline) and the underlying ground plane. The transverse or non-resonant dimension of the radiator is typically chosen, at least in part, as a function of the desired relative radiated power. If the non-resonant dimension is on the order of one wavelength or more, then typically multiple feed points are provided (e.g., via a corporate-structure feed network). Such microstrip radiators may typically also be arrayed with corporate or other structures of microstrip feedlines integrally formed and connected therewith.

As will also be appreciated by those in the art, such a dual-slotted microstrip radiator provides a relatively high r.f. impedance at its outermost edge (e.g., on the order of 200–300 ohms) and various lower impedances internally to a region of minimum r.f. impedance near the center of the radiator element. Accordingly, impedance matching "notches" are typically cut into the edge of such a microstrip radiator so as to permit a matched impedance feedline connection when the feedline is integrally formed and connected with the radiator in a single shaped layer of conductive surfaces.

Such conventional shaped microstrip antenna structures are usually formed by photo-chemical etching processes similar to those used for the formation of printed circuit boards. The material used is typically a relatively thin dielectric sheet (e.g. PTFE) clad on both sides with a thin layer of conductive metal. One such cladded side typically forms a ground or reference surface while the other side is photo-chemically etched into a shaped conducting surface so as to form the microstrip radiator and interconnected transmission line structures. The thickness of the whole structure is typically on the order of only 1/32 inch.

Where three element or terminal active devices are to be used in an oscillator circuit, there are also relatively well known circuit design techniques for determining the optimum oscillator load impedance using "device line measurements" or "load-pull measurements" based on the known S-parameters of the active device. Typical prior art references teaching oscillator design techniques such as these are, for example:

1. J. Gonda, "Large Signal Transistor Oscillator Design", IEEE MTT-S International Microwave Symposium Digest, 1972, pp. 110–112.

2. Walter Wagner, "Oscillator Design by Device Line Measurement", Microwave Journal, Volume 22, pp. 43–48, February 1979.

3. Hewlett-Packard Application Note 95-1, "S-Parameter Techniques for Faster More Accurate Network Design", p. 10.

4. Dennis Poulin, "Load-Pull Measurements Help Meet Your Match", Microwaves, Volume 19, pp. 61–65 (November 1980).

5. Hewlett-Packard Application Note 975, "A4.3 GHz Oscillator Using the HXTR-4101 Bipolar Transistor".

6. Hewlett-Packard Application Note 981, "The Design of a 900 MHz Oscillator with the HXTR-3102".

7. Microwave Semiconductor Application Note TE-213, "GaAs FET Power Oscillators".

I have now discovered a novel integrated oscillator/microstrip antenna system using a three-element active device (e.g., a bipolar transistor or FET transistor) which permits the three-element active device to be physically integrated (i.e., both mechanically and electrically) onto a single layer of shaped or "printed" conductor which includes the microstrip antenna radiator together with associated feedlines, series resonant oscillator reactance elements and d.c. biasing circuits. The microstrip antenna radiator and its feedline are situated so as to *directly* provide the optimum oscillator load impedance needed to maximize its power output. The composite structure is formed on one side of a dielectric sheet opposite a ground or reference plane provided on the other side of the dielectric sheet. The result is a thin, lightweight, conformal and efficient oscillator/antenna assembly. Although the frequency and power range of the overall system is obviously constrained by the active device used, within that envelope of limits, the microstrip antenna and/or other microstrip "printed" circuit elements determine both the frequency and the power that will be radiated from the system.

By incorporating the antenna system as an integral part of the three-element active device oscillator on a printed circuit board and by utilizing the microstrip antenna to directly provide the oscillator load impedance (thereby determining the frequency and power of the radiated signal), a simple low cost overall system is provided. At the same time, the integrated oscillator and microstrip antenna system is low profile, conformal and does not provide so many fabrication difficulties as many of the prior art systems described above. Furthermore, for some applications (e.g., fuzing) it may be desirable for each unit to operate at a slightly different frequency so as to minimize jamming possibilities or probabilities. Typical circuit board dielectric constants and etching variations will produce oscillatennas with this desirable operating frequency spread.

This invention not only provides a desired conformal low profile system, it permits easy control of frequency and maximum radiated power as well as maximum operating efficiency. Depending upon the three-element active device involved, the invention may be used from relatively low frequencies to very high frequencies (e.g., greater than 26 GHz) while reducing the cost of fabrication by the use of only simple microstrip circuitry in addition to the active device itself.

A conventional receiver antenna and detector circuit can be incorporated with an oscillatenna to provide a complete low cost microwave integrated circuit doppler radar for a variety of different applications:
proximity fuzing on projectiles and missiles
vehicle speed monitoring
collison avoidance systems
expendable decoys for jamming enemy radars or communications
telemetry These as well as other objects and advantages of the invention will be better appreciated by careful study of the following detailed description of the presently preferred exemplary embodiments of this invention taken in conjunction with the accompanying drawings, of which:

Figure 1:
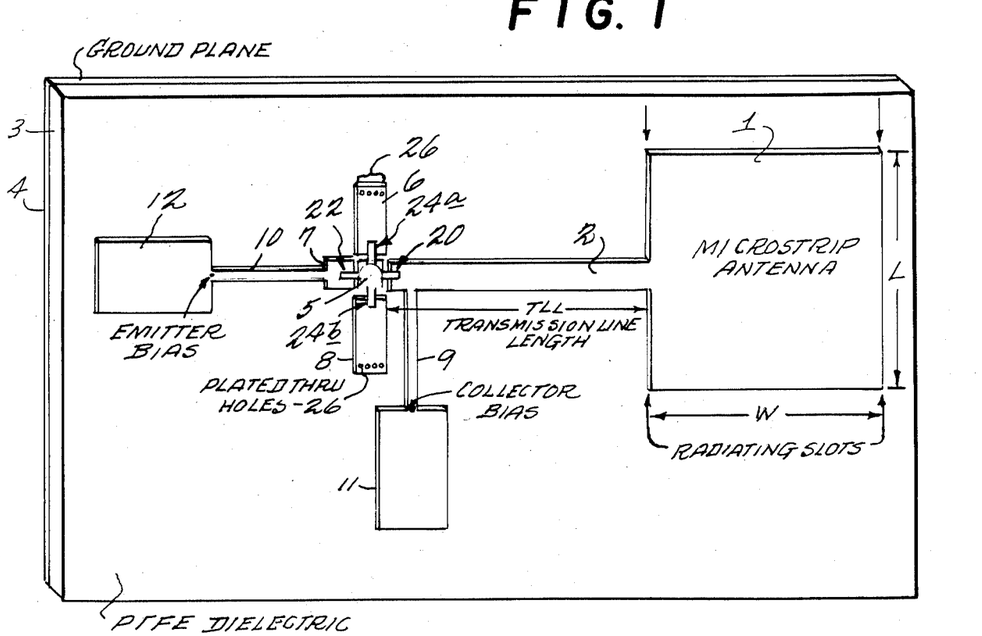
FIG. 1 is a partially perspective but essentially plan view of an exemplary embodiment of an oscillatenna constructed in accordance with this invention.

The exemplary oscillatenna embodiment depicted in FIG. 1 is formed from a conventional PTFE dielectric sheet 3 cladded on one side with a conductive ground plane 4 and, initially, similarly cladded on the opposite (or topside as shown in FIG. 1) with a single layer conductive surface mechanically supported in a spaced relationship from the ground plane 4 by the dielectric sheet 3. Using conventional photo-chemical etching techniques, the top single layer conductive surface is formed into a shaped single layer of conductive surfaces 1, 2, 6, 7, 8, 9, 10, 11 and 12. As previously mentioned, the dielectric layer is of a thickness substantially less than one-fourth wavelength at the intended operating frequency of the system (e.g., on the order of one-tenth wavelength or less). The overall thickness of the whole structure is typically on the order of only 1/32 inch.

The shaped conductive surfaces include a microstrip radiator 1 and a connected transmission line 2 which terminate in a first connection pad or area 20 to which an output element of the three-element active device 5 (e.g., the collector terminal of a bipolar junction transistor) is physically and electrically connected (e.g., as by soldering).

The shaped conductive surfaces also include a second connection pad or area 22 within surface 7 to which a second element (e.g., the emitter of a bipolar junction transistor) of the three-element active device 5 is physically and electrically connected (e.g., by soldering).

In the exemplary embodiment, the three-element active device 5 may be an HP HXTR 4104 bipolar junction transistor pre-packaged in a ceramic holder with collector and emitter element connections extending on opposite sides to connection pads 20 and 22 as already described. In such an exemplary embodiment, the third element (e.g, the base of a bipolar junction transistor) is actually provided with a pair of (electrically common) connection areas extending on the other opposing sides of the packaged active device 5 so as to be physically and electrically connected (e.g., by soldering) to third connection pads 24a and 24b of the shaped single layer conductive surfaces 6 and 8, respectively, all as shown in FIG. 1. Thus, the surfaces 6 and 8 are, in reality electrically connected in parallel with each other at the single third element (e.g., the base electrode) of the three-element active device 5.

Shaped conductive surfaces 2, 6, 7 and 8 may be considered as separate lengths of microstrip feedline. The microstrip feedline 2 connects the microstrip antenna 1 as the r.f. load to the output element of the active device. The line segments 6 and 8 are r.f. shorted to the underlying ground plane 4 by plated-through holes (or rivets or the like) 26 and are of a relatively short length (e.g, less than one-eighth wavelength) so as to present an essentially inductive reactance to the third or base electrode of the active element 5. Line segment 7 is essentially open circuited with respect to r.f. at its outer edge and also relatively short so as to provide an essentially capacitive reactance to the second or emitter electrode of the active device 5.

The emitter and collector (or other) d.c. bias is provided to the active element through r.f. blocking filter circuits comprising quarter wavelength (at the intended operating frequency) microstrip transmission line segments 10, 12 and 9, 11. The narrow segments 9 and 10 have a relatively high r.f. impedance (e.g., on the order of 100 ohms) while the wider quarter wavelength segments 11 and 12 have a relatively lower r.f. impedance (e.g., on the order of 20-30 ohms). Since the two successive quarter wavelength sections together comprise a half wavelength transmission line open circuited at its outer end, they also present an essentially r.f. open circuit at their connection points to shaped surfaces 7 and 2 as will be apparent to those skilled in the art. The transition from high to low impedance line segments provides an easy way to locate the appropriate connection points for the emitter and collector bias sources as depicted in FIG. 1 while at the same time causing the higher impedance segments 9 and 10 to present a substantially inductive reactance as compared with the largely capacitive reactance presented by the more expansive low impedance quarter wavelength line segments 11 and 12.

Figures 2, 3:
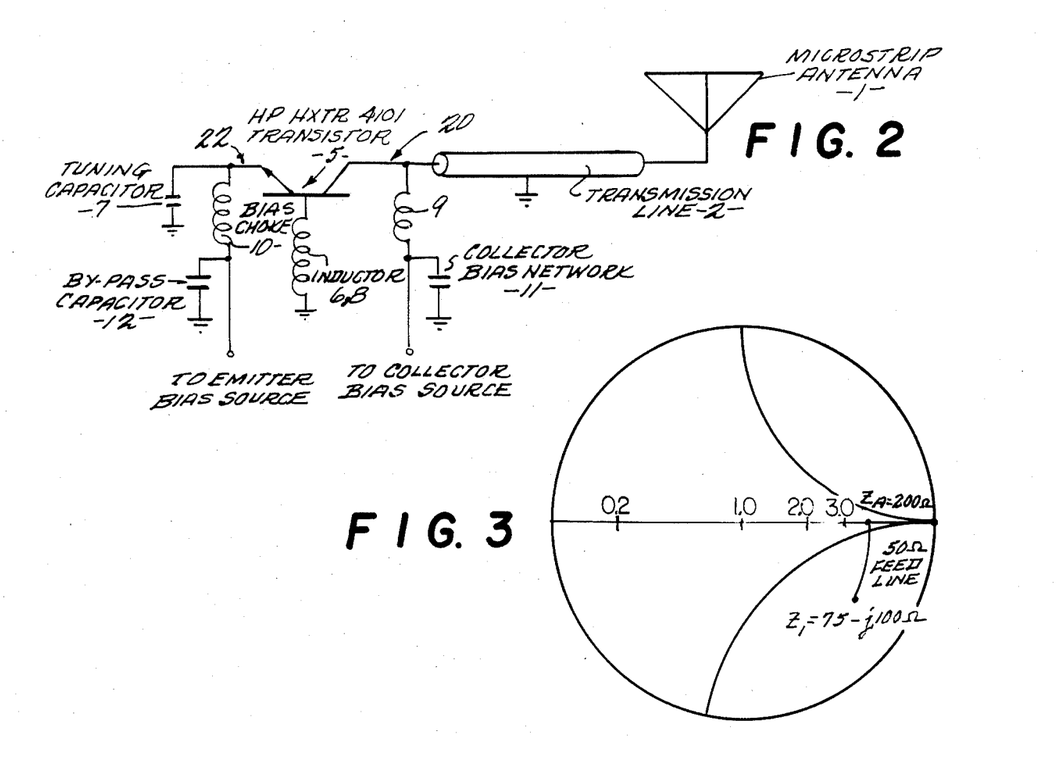
FIG. 2 is an electrical schematic diagram of an equivalent lumped parameter electrical circuit for the exemplary embodiment of FIG. 1.
FIG. 3 is a Smith Chart depicting the manner in which the input impedance of the microstrip antenna at its feed point is transformed along the microstrip feedline to directly provide the optimum predetermined load impedance required for the oscillator of the embodiment depicted at FIGS. 1 and 2.
Figure 5:
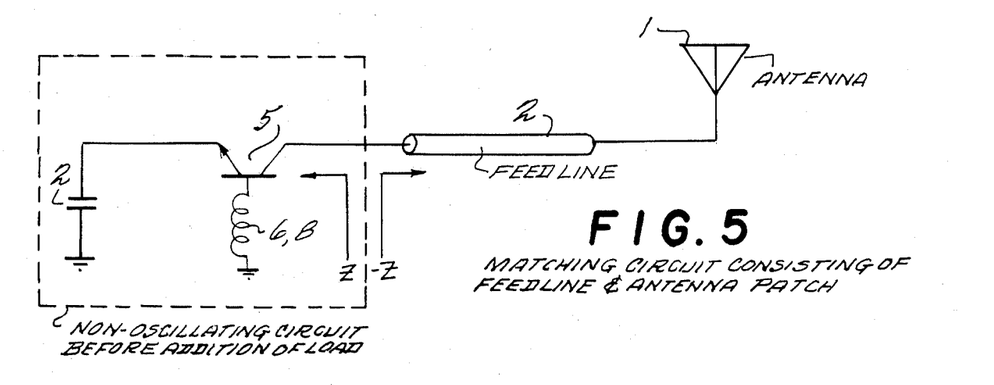
FIG. 5 is a simplified schematic diagram of the radio frequency circuit of the exemplary embodiments using a bipolar junction transistor.

The resultant lumped parameter equivalent electrical circuit network is depicted at FIG. 2 using the same reference numerals with respect to the corresponding lumped parameters. It will be seen that the bipolar junction transistor 5 is connected in a conventional common base oscillator circuit and that the r.f. load impedance for the active element 5 is provided directly and solely by the microstrip antenna 1 and the connected transmission line 11. The purely r.f. equivalent circuit is also depicted at FIG. 5. The capacitor 7 in this embodiment appears to have the most control over oscillator frequency and thus may be thought of as a "tuning" element that can be used in the design stage to primarily determine the final oscillator frequency—which is, of course, also affected by the inductances 6, 8 and by the resonant frequency of the microstrip antenna 1.

A two-step process was used to design the exemplary oscillatenna of FIGS. 1, 2 and 5. First, a non-oscillating circuit was designed using the measured S-parameters of the active device (e.g. the HXTR 4101 transistor). A common base transistor configuration was selected based on the operating performance and the availability of measured small signal S-parameters. The output impedance of the circuit as a function of input power was then measured with a network analyzer in a device line test system of conventional design and in accordance with the oscillator design principles explained in the earlier referenced published articles. When the reflected power minus the input power (i.e., the added power) at the output port of the test circuit reaches a maximum value, the output impedance is noted. This measured output impedance at the maximum added power point should be negative as a result of a reflection coefficient greater than unity within the circuit. In the exemplary embodiment, the maximum added power was approximately 18 dBm—which also represents the output power which can be achieved from the oscillator when it is matched to a load impedance equal to the negative of the thusly measured output impedance (again all in accordance with conventional device-line or load-pull oscillator design techniques). In the exemplary embodiment, the required load impedance of 75 -j100 ohms and was obtained directly by interchanging the test and reference arms on the network analyzer (in accordance with the direct device line measurement technique described in Hewlett-Packard Application Note 95-1 earlier referenced). On the other hand, if the test circuit had initially produced oscillations at or near the design frequency, the load-pull measurement technique of the earlier referenced Poulin article could have been used to determine the optimum load impedance rather than the device line measurement technique typically used for a non-oscillating circuit. Accordingly, the first step of the design process is strictly in accordance with conventional oscillator design techniques.

However, in the second step of the design process, rather than transforming the oscillator output impedance to 50 ohms with a matching network, similarly transforming the microstrip antenna to 50 ohms and interconnecting the thus matched antenna and output impedance with a 50 ohm transmission line, a microstrip antenna and feedline are used in this exemplary embodiment to *directly* provide the r.f. load impedance for the oscillator circuit. Using a microstrip antenna, it is possible to obtain the requisite load impedance to produce maximum power output from the active device and into the antenna structure where it can be radiated. In this way, the overall efficiency of the oscillatenna may be greatly enhanced.

This desired result is made possible, for example, because a dual-slotted microstrip antenna typically provides input resistance at resonance in the relatively high range of 250-300 ohms or so. This relatively high antenna input resistance can then be transformed to the desired predetermined load impedance for maximum added power in the oscillator design by adding a feedline of appropriate length. In essence, the feedline length can now be optimized to obtain maximum radiated power.

In an experimental version of the exemplary embodiment of FIG. 1, the microstrip radiator 1 was formed from an approximately 1.0"×1.0" conductive adhesive patch which could thus be moved to successive different positions along the preprinted microstrip transmission line 2. The resulting experimental data depicted below at Table I shows that maximum effective radiated power of 24.4 dBm EIRP was obtained at 3.5 GHz using a d.c. input power of only 450 milliwatts.

TABLE I
OSCILLATENNA FREQUENCY AND RADIATED POWER AS A FUNCTION OF FEEDLINE LENGTH

| Feedline Length | Frequency | Effective Radiated Power |
|---|---|---|
| 0.7 inch | 3.75 GHz | 22.0 dBm |
| 0.9 inch | 3.60 GHz | 23.7 dBm |
| 1.0 inch | 3.60 GHz | 21.4 dBm |
| 1.1 inches | 3.5 GHz | 24.4 dBm |
| 1.15 inches | 3.45 GHz | 23.2 dBm |
| 1.2 inches | 3.38 GHz | 21.1 dBm |

A Smith Chart is depicted at FIG. 3 to show how the length of feedline 2 effectively rotates be 200 ohm edge impedance of microstrip radiator 1 to the requisite 75-j100 ohm load impedance required for the optimum design load impedance of the oscillator.

To again briefly summarize, the overall oscillator design procedure is generally known in the art and described in detail in the earlier cited references. The active device to be used is typically situated in a non-oscillatory circuit and its output impedance is measured as a function of input power. The output impedance noted at the maximum added power condition is then replaced by the negative of the noted output impedance to obtain maximum oscillator efficiency.

This invention now permits this known design technique to be applied to three element active device oscillatennas where a solid-state three-element active device is soldered or otherwise integrated onto or into a single layer of "printed" conductive surfaces which comprise the antenna radiator together with associated feedlines, oscillator r.f. resonant and d.c. biasing circuits all formed on one side of the dielectric sheet opposite a ground or reference plane provided on the other side of the sheet so as to result in a thin, lightweight, conformal and efficient oscillatenna assembly.

This result is achieved by suitably tailoring (e.g., proper width, length), a microstrip radiator 1 and its associated microstrip transmission line which are chosen so as to provide the predetermined requisite r.f. load impedance for the oscillator circuit. In particular, one does *not* transform the desired load impedance to match a standard transmission line value (e.g., 50 ohms) which is, at its other end, also matched to the antenna impedance. Rather, the desired load impedance for the oscillator is *directly* provided by the microstrip antenna and its associated transmission line.

Quarter wavelength high and low impedance transmission line segments are used to create d.c. bias feeding networks that are isolated from the higher r.f. output frequencies. Other shaped conductive surfaces are also included to provide the requisite reactive impedances which typically act in concert with the output load to form a resonant oscillator circuit with the three-element active device.

Figure 4:
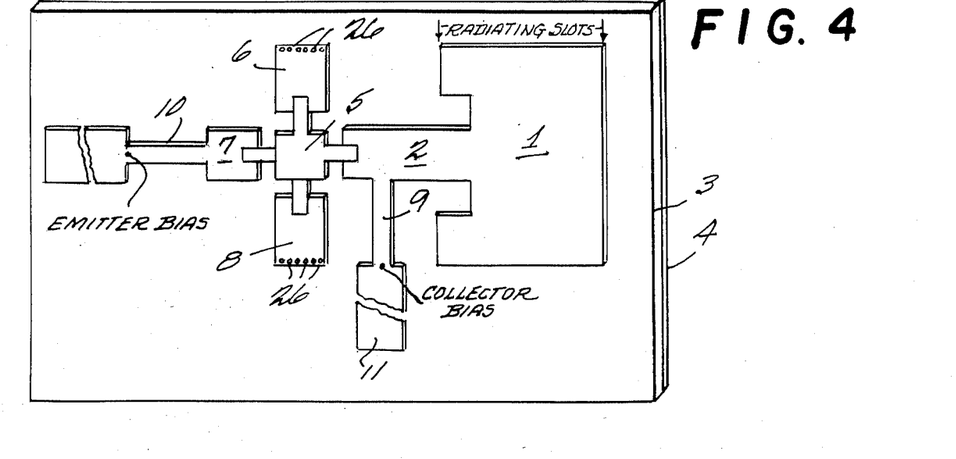
FIG. 4 is a view of an exemplary embodiment of this invention similar to that shown in FIG. 1 but including slight alterations (e.g., the use of a "notch" at the microstrip antenna feed point to assist in selecting the desired predetermined oscillator load impedance.

The oscillatenna embodiment depicted at FIG. 4 is quite similar to that depicted in FIG. 1. However, it will be observed that the transmission line 2 is considerably shorter and that its connection point with the microstrip radiator 1 is at a notch or indented area so as to select a slightly lower input impedance point on the microstrip radiator 1. In effect, the transmission line 2 of the FIG. 1 embodiment is approximately one-half wavelength longer than necessary so as to provide sufficient space to permit the experimental changing of the feedline length as reported above in Table I. A considerably shorter length transmission line 2 may be used to transform to the desired oscillator load impedance—even if one must start with a somewhat lower antenna input impedance (e.g. by using a notched connection area).

As depicted in FIG. 4, the integrated oscillator/microstrip antenna system (oscillatenna) includes a half wave (dual radiating slots) microstrip antenna element 1 and a microstrip/three-element active device oscillator connected directly to the antenna element 1 via a transmission feedline 2. As in the earlier embodiment, the oscillatenna of FIG. 4 is fabricated on a dielectric substrate 3 which has a conducting ground plane 4 on its other side.

Mutiple antenna elements formed in an array (e.g., an array of square, rectangular, circular or other geometrically-shaped microstrip radiators) with corporate, series or other transmission line feed networks may be used to obtain desired radiation patterns while still providing virtually any desired oscillator load impedance. In effect, the microstrip antenna element(s) and associated feedline structure(s) complete the oscillator and *directly* provide the required load impedance for oscillation of the active element at maximum efficiency.

The oscillatenna circuit includes a three-element active device 5 (e.g., a bipolar or GaAs FET transistor), reactive r.f. impedance oscillator circuitry (e.g., capacitance 7 and inductors 6, 8) together with appropriate bias connection circuitry formed from quarter wavelength high impedance transmission line segments 9 and 10 and quarter wavelength low impedance transmission line segments 11 and 12. Plated-through holes 26 may typically be used to obtain inductive reactance from relatively short elements 6 and 8 as should be appreciated by those in the art.

As with the earlier embodiment, the oscillator circuitry exclusive of the antenna and its associated transmission line load impedance is first designed using device S-parameters measured at the desired frequency of oscillation. Then using device line or load-pull measuring techniques (e.g., as described in the above-referenced articles by Wagner or Poulin), a load impedance corresponding to the maximum added power at the desired frequency of oscillation is determined in accordance with conventional oscillator design techniques. The maximum added power represents the power output expected from the completed oscillator if the load impedance is replaced by the negative of the thus measured output impedance at maximum added power conditions. A microstrip antenna 1 and its associated microstrip feedline 2 are then designed to provide this predetermined requisite load impedance directly to the output terminal of the three-element active device 5. The radiated frequency and power can be varied somewhat by changing the antenna patch and feedline size and can be optimized for maximum output power, for example, by modifying the feedline impedance and/or length—as earlier explained in connection with the embodiment of FIG. 1.

If the design procedure of Hewlett-Packard Application Note 975 is to be utilized, the design of an oscillatenna in accordance with this invention can be summarized as follows:

(1) The transistor is placed in a non-oscillating microstrip circuit (e.g. of the FIGS. 1 or 4 type but without the microstrip antenna 1 and associated feedline 2, see FIG. 2 of Hewlett-Packard Application Note 975).

(2) The output impedance of this non-oscillating circuit is measured as a function of input power.

(3) At each power level the reflected power is recorded.

(4) The incident power is subtracted from the reflected power to provide added power data at each power level.

(5) The circuit output impedance is measured at the power level corresponding to maximum added power.

(6) By reversing the reference and test arms on the network analyzer, the reflection coefficient (which is greater than 1) will be inverted and will now lie inside the standard Smith Chart (outer circle of the Smith Chart corresponds to a reflection coefficient of one). This is then the negative of the impedance displayed before reversing the network analyzer arms. It is this thus determined impedance that must be connected as a load to complete the optimized oscillator circuit.

(7) Rather than matching this predetermined impedance to 50 ohms (as would conventionally be done when designing just an oscillator), this predetermined impedance is provided directly by a microstrip antenna patch and its associated microstrip feedline (more than one patch and corporate or series feed network can also be utilized as should be appreciated).

(8) By combining the microstrip antenna/microstrip feedline and partial oscillator circuit characterized above, an oscillatenna results with maximum power at the design frequency.

A square one-half wavelength microstrip radiator patch produces an edge impedance (resistance) at resonance of about 250-300 ohms. Often this will be an impedance which can be used directly through the transmission line to provide the requisite oscillator load impedance, thus no modifications to the patch antenna may be necessary in some situations (e.g., such as indenting the feedline into the patch to reduce the starting impedance at the antenna input).

By adding one-half wavelength to the transmission line length TLL in an experimental prototype, th eline length is more practical for testing the optimum patch placement. A 0.95"×1.0" patch was used initially and the patch design equations are:

$$\text{Patch Width, } W = \frac{C}{2f_r}\left(\frac{Er + 1}{2}\right)^{-\frac{1}{2}} \quad \text{(Equation 1)}$$

where:
$Er$ = material dielectric constant,
$f_r$ = resonant frequency, and $$C = \frac{2.998 \times 10^8}{.254} \text{ inches/sec}$$

$$\text{Patch Length, } L = \frac{C}{2f_r \sqrt{E_e}} - 2\Delta l \quad \text{(Equation 2)}$$

$$\text{where, } E_e = \frac{Er + 1}{2} + \frac{Er - 1}{2}\left(1 + \frac{12h}{W}\right)^{-\frac{1}{2}}, \text{ and} \quad \text{(Equation 3)}$$

$$\frac{\Delta l}{h} = \frac{.412(Ee + .3)(w/h + .264)}{(Ee - .288)(w/h + .8)} \quad \text{(Equation 4)}$$

where
$h$ = substrate thickness.

Figure 6:
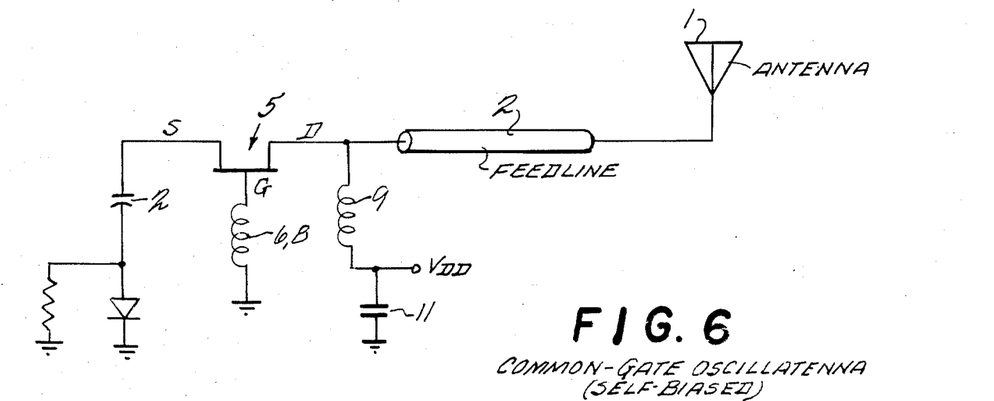
FIG. 6 is a schematic diagram similar to FIG. 5 but using a field effect transistor instead of a bipolar junction transistor as the three element active device.

As should be appreciated, other than common base junction transistor oscillator circuits can also be employed. For example, a typical common gate oscillator circuit (self-biased) as depicted in FIG. 6 is another quite feasible oscillatenna embodiment which is especially preferred for higher frequency operation. Other basic oscillator circuits may also be preferred for particular applications as well be appreciated by those in the art.

Although only a few specific exemplary embodiments of this invention have been described in detail above, those skilled in the art will appreciate that there are many possible modifications and variations which may be made in these exemplary embodiments while still retaining many of the novel features and advantages of this invention. Accordingly, all such variations and modifications are intended to be included within the scope of the appended claims.

What is claimed is:

1. An integrated oscillator and microstrip antenna system comprising:
   a 3-element active device;
   an electrically conductive reference surface;
   a shaped single layer of conductive surfaces spaced from said reference surface by a distance substantially less than one-fourth wavelength at the intended operating frequency of the system;
   said conductive surfaces including a microstrip radiator means and microstrip transmission line means directly connected as a load to an element of said active device without impedance matching to the microstrip transmission line means which radiator means and microstrip transmission line means together directly present a predetermined r.f. load impedance at said intended operating frequency; and
   the three elements of said active device beign elecrically and mechanically connected to said conductive surfaces to form an oscillator circuit having a load impedance provided directly by said microstrip radiator means and said microstrip transmission line means without any impedance matching to the transmission line means,
   wherein said microstrip transmission line means is dimensioned for electrically transforming the impedance of the microstrip radiator means connected thereto into the predetermined r.f. load impedance at said intended operating frequency and for presenting said predetermined impedance to said active device element.

2. An integrated oscillator and microstrip antenna system as in claim 1 wherein said transmission line means is connected at one end to one element of said active device and connected at its other end to a predetermined point on the periphery of the microstrip radiator means having a first predetermined impedance and wherein said transmision line means has a length dimension which transforms the said first predetermined impedance of the microstrip radiator means to the predetermined r.f. load impedance for the oscillator required to maximize the power output of the active device.

3. An integrated oscillator and microstrip antenna system as in claim 1 or 2 wherein second and third elements of said active device are respectively connected to second and third portions of said shaped single layer of conductive surfaces, said second and third portions being formed to provide respective r.f. impedances which, together, define a substantially resonant series r.f. circuit at said intended operating frequency.

4. An integrated oscillator and microstrip antenna system as in claim 3 wherein said third element of the active device is provided with two electrical contacts and wherein said third portion of the shaped single layer of conductive surfaces includes two separate areas electrically connected in parallel to said third element respectively via its two electrical contacts.

5. An integrated oscillator and microstrip antenna system as in claim 3 wherein said shaped single layer of conductive surfaces further comprises:

first and second r.f. choke/d.c. bias feed means individually electrically connected to two respective ones of the elements of the active device for feeding electrical d.c. bias currents to the active device without substantially loading the resonant series r.f. circuit.

6. An integrated oscillator and microstrip antenna system as in claim 5 wherein said first and second r.f. choke/d.c. bias feed means each comprise two successive quarter wavelength (at the intended operating frequency) segments, the first of which has a relatively higher r.f. impedance than the other segment and wherein a connection to a d.c. bias is made at the juncture of these two segments.

7. An integrated oscillator and microstrip antenna system as in claim 3 wherein said second portion of said shaped single layer of conductive surfaces provides a substantially capacitive reactance at the intended operating frequency and wherein said third portion of said shaped single layer of conductive surfaces provides a substantially inductive reactance at the intended operating frequency.

8. An integrated oscillator and microstrip antenna system as in claim 7 wherein said third element of the active device is provided with two electrical contacts and wherein said third portion of the shaped single layer of conductive surfaces includes two separate areas electrically connected in parallel with each other at said third element respectively via its two electrical contacts.

9. An integrated oscillator and microstrip antenna system as in claim 7 wherein said shaped single layer of conductive surfaces further comprises:

first and second r.f. choke/d.c. bias feed means individually electrically connected to two respective ones of the elements of the active device for feeding electrical d.c. bias currents to the active device without substantially loading the resonant series r.f. circuit.

10. An intended oscillator and microstrip antenna system as in claim 9 wherein said first and second r.f. choke/d.c. bias feed means each comprise two successive quarter wavelength (at the intended operating frequency) segments, the first of which has a relatively higher r.f. impedance than the other segment and wherein a connection to a d c. bias is made at the juncture of these two segments.

11. An integrated oscillator and microstrip antenna system comprising:

(a) a conductive reference surface;
(b) a dielectric layer overlyng said reference surface and having a thickness substantially less than one-fourth wavelength at the intended operating frequency of the system;
(c) a shaped single layer conductive surface overlying and supported by said dielectric layer above said reference surface and wherein said shaped single layer conductive surface includes:
  (i) at least one microstrip radiator means having a resonant dimension at said intended operating frequency and defining at least one radiating slot between an edge of the radiator means and the underlying reference surface,
  (ii) microstrip transmission line means extending from the periphery of said at least one radiator means to a first connection pad, and
  (iii) a second connection pad and at least one third connection pad extending to respectively associated microstrip reactance and bias feed circuitry; and
(d) a 3-element active device having at least three connection areas electrically connected respectively to said first, second and third connection pads;

said radiator means, through said microstrip transmission line means, directly providing the predetermined load impedance for the remainder of the system required to cause the active device to oscillate with delivery of substantially maximum output power at said intended operating frequency without impedance matching to the transmission line means, said microstrip transmission means being dimensioned for electrically transforming the impedance of the radiator means to the predetermined load impedance for the active device at said intended operating frequency.

12. An integrated oscillator and microstrip antenna system as in claim 11 wherein said active device is a bipolar junction transistor having base, emitter and collector elements and having its collector element electrically connected to said first connection pad.

13. An integrated oscillator and microstrip antenna system as in claim 12 wherein said emitter element is connected to said second connection pad and wherein said second connection pad extends back through a first tuning capacitance section of microstrip circuitry and two successive quarter wavelength (at the intended operating frequency) microstrip transmission line segments, the first one of which has a relatively higher r.f. impedance and wherein a connection to a d.c. emitter bias is made at the junction of these two line segments, wherein the tuning capacitance segment provides an r.f. frequency tuning capacitance, the first quarter wavelength segment provides an r.f. choke inductance and the second quarter wavelength segment provides an r.f. bypass capacitance.

14. An integrated oscillator and microstrip antenna system as in claim 12 or 13 wherein two successive quarter wavelength (at the intended operating frequency) microstrip transmission line segments extend from said transmission line means, a first one of which has a relatively higher r.f. impedance and wherein a connection to a d.c. collector bias is made at the juncture of these line segments, wherein the first one of the segments provides an r.f. choke inductance and the second segment provides an r.f. bypass capacitance.

15. An integrated oscillator and microstrip antenna system as in claim 14 wherein said base element is connected to said third connection pad which extends back through a microstrip transmission line to an r.f. electrical connection to the underlying reference surface which thereby connects an inductive r.f. impedance between said base element and said reference surface.

16. An integrated oscillator and microstrip antenna system as in claim 15 wherein said base element of the active device has electrically common contact areas at opposite sides of the active element and wherein said shaped conductive surface includes a fourth connection pad opposingly disposed but substantially identical in shape and electrical characteristics to said third connection pad, said third and fourth connection pads being connected respectively to the electrical contact areas of said base element located at opposite sides of the active element.

17. An integrated oscillator and microstrip antenna system as in claim 12 or 13 wherein said base element is connected to said third connection pad which extends back through a microstrip transmission line to an r.f. electrical connection to the underlying reference surface which thereby connects an inductive r.f. impedance between said base element and said reference surface.

18. An integrated oscillator and microstrip antenna system as in claim 17 wherein said base element of the active device has electrical contact areas at opposite sides of the active element and wherein said shaped conductive surface includes a fourth connection pad opposingly disposed but substantially identical in shape and electrical characteristics to said third connection pad, said third and fourth connection pads being connected respectively to the electrical contact areas of said base element located at opposite sides of the active element.

19. A system as in claim 1 wherein said active device produces oscillations at said intended operating frequency only when said microstrip transmission line means is directly connected to said active device.

20. A system as in claim 1 wherein:
said microstrip radiator means includes an edge, and
said microstrip transmission line means is directly conected to said radiator means edge and rotates the radiator means edge impedance to said predetermined r.f. load impedance.

21. A system as in claim 1 wherein said radiator means and microstrip transmission line means together directly present a predetermined r.f. load impedance substantially equal to the negative of the output impedance of said active device at said intended operating frequency.

22. A system as in claim 1 wherein said microstrip transmission line means comprises a linear elongated conductive surface having substantially uniform width and is directly connected at one end thereof to said radiator means and directly connected at the other end thereof to said active device; and
the length of said microstrip transmission line means is dimensioned such that said transmission line means transforms the impedance of the microstrip radiator means connected at said one end of the predetermined r.f. load impedance at said other end.

23. A system as in claim 1 wherein said microstrip transmission line means comprises an elongated strip of said conductive surfaces having substantially uniform width and spaced from said reference surface by a distance substantially less than ¼ wavelength at the intended operating frequency.

24. A system as in claim 11 wherein said active device produces oscillations at said intended operating frequency only when said microstrip transmission line means is directly connected to said active device.

25. A system as in claim 11 wherein said microstrip transmission line means rotates the radiator means edge impedance to said predetermined r.f. load impedance at said intended operating frequency.

26. A system as in claim 11 wherein said radiator means and microstrip transmission line means together directly present a predetermined r.f. load impedance substantially equal to the negative of the output impedance of said active device at said intended operating frequency.

27. A system as in claim 1 wherein said microstrip transmission line means comprises a linear elongated conductive surface having substantially uniform width and is connected at one end thereof to said first connection pad, and the length of said thereof to said first connection pad, and the length of said microstrip transmission line means is dimensioned such that said transmission line means transforms the impedance of the microstrip radiator means connected at said one end to the predetermined r.f.load impedance at said other end thereof.

28. A system as in claim 11 wherein said microstrip transmission line means compriss an elongated strip of said conductive surace having substantially uniform width and spaced from said reference surface by a distance substantially less then ¼ wavelength at the intended operating frequency.

29. A system as in claim 1 wherein the length of said microstrip transmission line means is optimized so as to maximize the output power radiated by said microstrip radiator means at said intended operating frequency.

30. A system as in claim 11 wherein the length of said microstrip transmission line means is optimized so as to maximize the output power radiated by said microstrip radiator means at said intended operating frequency.

31. An integrated oscillator and microstrip antenna system for radiating RF signals at an intended radio operating frequency, said system comprising:
oscillator means for producing radio frequency signals at said intended operating frequency, said oscillator means including an active device having an output element and at least two additional elements, said oscillator means delivering a maximum signal output at said intended operating frequency when an optimum RF load impedance is connected to said active device output element;
an electrically conductive reference surface;
a shaped single layer of conductive surfaces spaced from said reference surface by a distance substantially less than one-fourth wavelength at said intended operating frequency, the elements of said active device being electrically and mechanically connected to said conductive surfaces;
microstrip radiator means comprising a first portion of said conductive surfaces for radiating said radio frequency signals, said conductive surfaces first portion defining a terminal point thereon, said conductive surfaces first portion being dimensioned such that approximately said optimum RF load impedance exists at said terminal point; and
microstrip transmission line means for coupling said radio frequency signals from said active device output terminal to said microstrip radiator means terminal point, said microstrip transmission line means comprising an elongated strip of conductive surface spaced from said reference surface by a distance substantially less than one-fourth wavelength at said intended operating frequency, said strip having first and second ends, said strip first end being directly electrically and mechanically connected to said active device output element, said strip second end being directly electrically and mechanically connected to said microstrip radiator means terminal point, no additional impedance matching elements being connected between said microstrip transmission line means and said active device output element, no additional impedance matching elements being connected between said microstrip transmission line means and said microstrip radiator means, said microstrip radiator means and microstrip transmission line means together directly presenting substantially said optimum RF load impedance at said intended operating frequency to said active device output element, aid microstrip transmission line means being dimensioned for electrically transforming the RF load impedance presented at the microstrip radiator means terminal point into substantially the optimum RF load impedance at said intended operating frequency and for directly presenting said substantially optimum impedance to said active device output element.

32. A system as in claim 31 wherein said microstrip radiator means includes an edge having a notch defined therein which modifies the load impedance said radiator means presents at said terminal point.

33. A system as in claim 31 wherein said transmission line means has a length dimension which is one-half wavelength at said intended operating frequency plus an addition length which electrically transforms the RF load impedance presented at the microstrip radiator means terminal point into substantially the optimum RF load impedance at said intended operating frequency.

34. A system as in claim 31 wherein said microstrip radiator means and said oscillator means are physically postioned with respect to one another so as to facilitate directly connecting said transmission line means therebetween without additional impedance matching elements.

* * * * *